United States Patent [19]

Hoffman et al.

[11] Patent Number: 5,455,387
[45] Date of Patent: Oct. 3, 1995

[54] SEMICONDUCTOR PACKAGE WITH CHIP REDISTRIBUTION INTERPOSER

[75] Inventors: Paul R. Hoffman, Modesto; Keshav B. Prasad, Santa Clara, both of Calif.; Thomas Caulfield, Croton Falls, N.Y.; Sean T. Crowley, Plano, Tex.

[73] Assignees: Olin Corporation, Stamford, Conn.; Cyrix Corporation, Richardson, Tex.; International Business Machines Corporation, Armonk, N.Y.

[21] Appl. No.: 276,564

[22] Filed: Jul. 18, 1994

[51] Int. Cl.⁶ .................................................. H01L 23/02
[52] U.S. Cl. .......................................... 174/52.4; 361/712
[58] Field of Search ............................. 174/52.1–52.4; 257/666, 675, 700, 701, 706, 707, 712, 713; 361/704, 707, 709–711, 712–713, 718, 820

[56] References Cited

U.S. PATENT DOCUMENTS

| | | | |
|---|---|---|---|
| 4,461,924 | 7/1984 | Butt | 174/52 FP |
| 4,480,013 | 10/1984 | Doi et al. | 428/616 |
| 4,618,739 | 10/1986 | Theobald | 174/52 FP |
| 4,630,172 | 12/1986 | Stenerson et al. | 361/386 |
| 4,631,820 | 12/1986 | Harada et al. | 29/840 |
| 4,677,526 | 6/1987 | Muehling | 361/386 |
| 4,750,092 | 6/1988 | Werther | 361/400 |
| 4,754,317 | 6/1988 | Comstock et al. | 357/70 |
| 4,771,330 | 9/1988 | Long | 357/80 |
| 4,774,635 | 9/1988 | Greenbert et al. | 361/421 |
| 4,800,419 | 1/1989 | Long et al. | 357/70 |
| 4,816,426 | 3/1989 | Bridges et al. | 437/207 |
| 4,823,234 | 4/1989 | Konishi et al. | 361/386 |
| 4,888,449 | 12/1989 | Crane et al. | 174/52.4 |
| 4,890,152 | 12/1989 | Hirata et al. | 357/72 |
| 4,897,508 | 1/1990 | Mahulikar et al. | 174/52.4 |
| 4,903,114 | 2/1990 | Aoki et al. | 357/70 |
| 4,939,316 | 7/1990 | Mahulikar et al. | 174/52.4 |
| 5,013,871 | 5/1991 | Mahulikar et al. | 174/52.4 |
| 5,015,803 | 5/1991 | Mahulikar et al. | 174/52.4 |
| 5,041,696 | 8/1991 | Utner | 174/52.4 |
| 5,066,368 | 11/1991 | Pasqualoni et al. | 204/58 |
| 5,073,521 | 12/1991 | Braden | 437/209 |
| 5,077,595 | 12/1991 | Fukunaga | 357/40 |
| 5,098,864 | 3/1992 | Mahulikar | 437/221 |
| 5,103,292 | 4/1992 | Mahulikar | 357/74 |
| 5,124,783 | 6/1992 | Sawaya | 357/81 |
| 5,157,588 | 10/1992 | Kim et al. | 174/52.4 X |
| 5,283,717 | 2/1994 | Hundt | 174/52.2 X |
| 5,294,826 | 3/1994 | Marcantonio et al. | 257/659 |
| 5,345,106 | 9/1994 | Doering et al. | 257/675 |

Primary Examiner—Leo P. Picard
Assistant Examiner—Christopher Horgan
Attorney, Agent, or Firm—Perman & Green

[57] ABSTRACT

An electronic package with a semiconductor chip, a lead frame, a metal casing, and a redistribution interposer. The chip is mounted on the interposer and wirebonded to first ends of redistribution leads of the interposer. The redistribution leads have second ends orientated in a general flipped orientation relative to their corresponding first ends. The second ends are wirebonded to pads of the lead frame. The interposer allows smaller chips to be used in the package without changing the lead frame. The interposer also allows the chip to be flip-mounted in the package without changing the lead frame or casing, this allows redirection of the chip's thermal path.

24 Claims, 5 Drawing Sheets

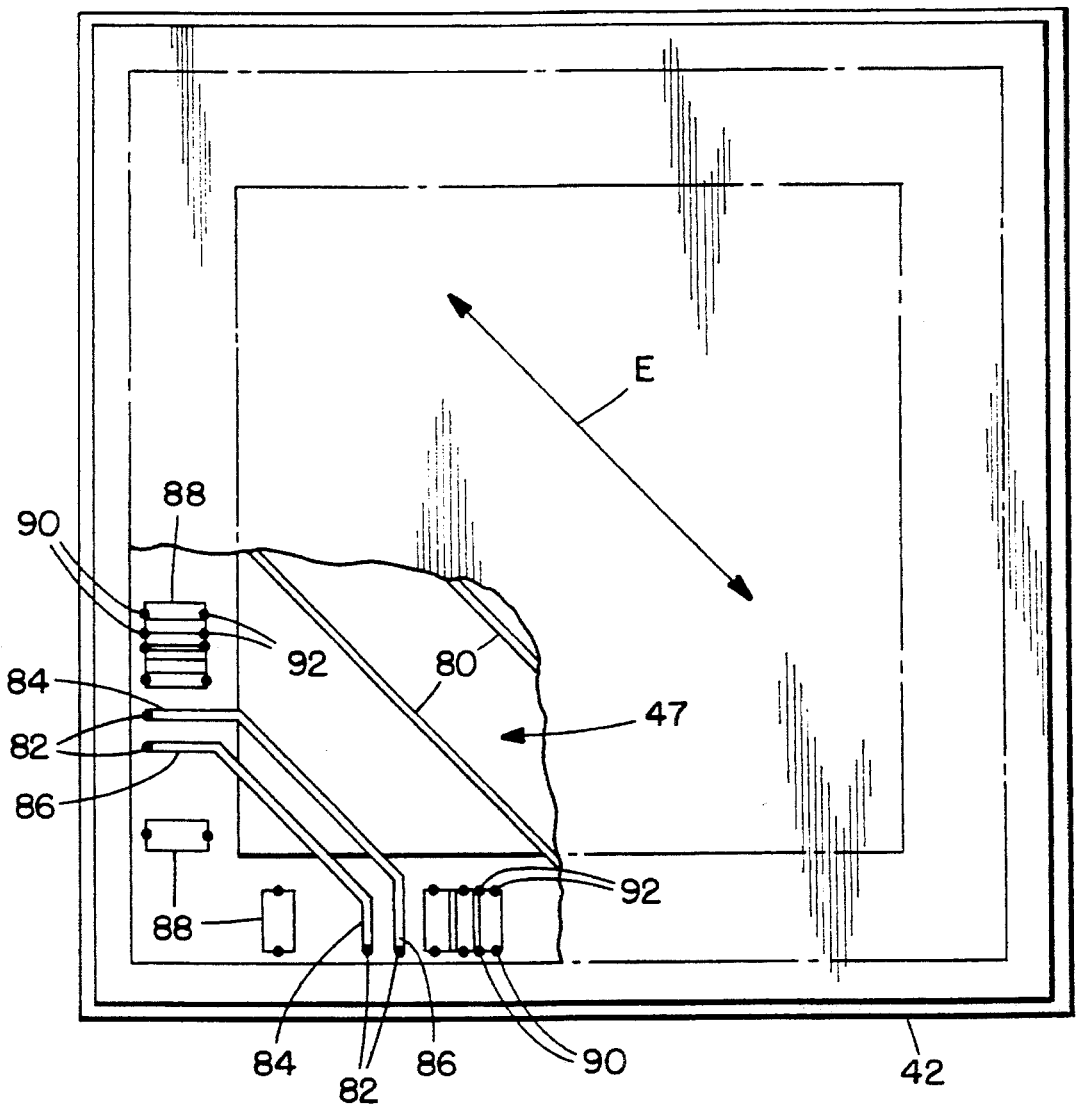

SEMICONDUCTOR PACKAGE WITH CHIP REDISTRIBUTION INTERPOSER

BACKGROUND OF THE INVENTION

1. Field of the Invention

The present invention relates to electronic devices and, more particularly, to a package having a redistribution interposer between a chip and a lead frame.

2. Prior Art

U.S. Pat. No. 4,461,924 discloses a semiconductor chip connected by wire leads to a lead frame with a metal casing enclosing the chip and wire leads. Other semiconductor packages are disclosed in U.S. Pat. Nos. 4,888,449; 4,897,508; 4,939,316; 5,013,871; 5,066,368; 5,073,521; 5,098,864; 5,103,292; and 5,015,803. Leads and contact areas connected in series are disclosed in U.S. Pat. Nos. 5,077,595; 5,124,783; 4,480,013; 4,631,820; 4,754,317; 4,774,635; 4,771,330; 4,800,419; and 4,903,114. Pin grid array (PGA) packages are also known in the art as disclosed in U.S. Pat. Nos. 4,630,172; 4,677,526; 4,816,426; 4,750,092; 4,890,152; 4,823,234; and 4,618,739.

SUMMARY OF THE INVENTION

In accordance with one embodiment of the present invention, in an electronic package having an electrical component, a lead frame, and a casing, the improvement comprises a redistribution interposer having at least one group of redistribution conductors. Each redistribution conductor has a first end electrically connected to a pad on the electrical component and a second end electrically connected to a pad of the lead frame. At least some of the second ends are located at different sides of the interposer then corresponding first ends of the same conductor.

In accordance with another embodiment of the present invention an electronic package is provided comprising a semiconductor chip, a redistribution interposer, a lead frame, and a casing. The semiconductor chip has electrical connection areas. The interposer has at least two layers of redistribution leads. Each lead has a first end and a second end. The first ends are electrically connected to the electrical connection areas of the chip. The lead frame has electrical connection pads. The second ends of the redistribution leads are electrically connected to the electrical connection pads. The casing is connected to the lead frame and encloses, at least partially, the chip and the interposer.

In accordance with one method of the present invention, a method of assembling an electronic package is provided comprising steps of electrically connecting an electronic chip to a redistribution interposer. The interposer has redistribution leads with first ends and second ends. The second end of each redistribution lead is located in a flip orientation relative to its corresponding first end. The chip is electrically connected to the first ends. The method further comprises electrically connecting the second ends of the redistribution leads to connection pads on a lead frame.

BRIEF DESCRIPTION OF THE DRAWINGS

The foregoing aspects and other features of the invention are explained in the following description, taken in connection with the accompanying drawings, wherein:

FIG. 4D is a schematic bottom view of the interposer as in FIG. 4A with a cut away section showing a fourth layer having another group of redistribution traces or circuits;

DETAILED DESCRIPTION OF THE INVENTION

Figure 1:
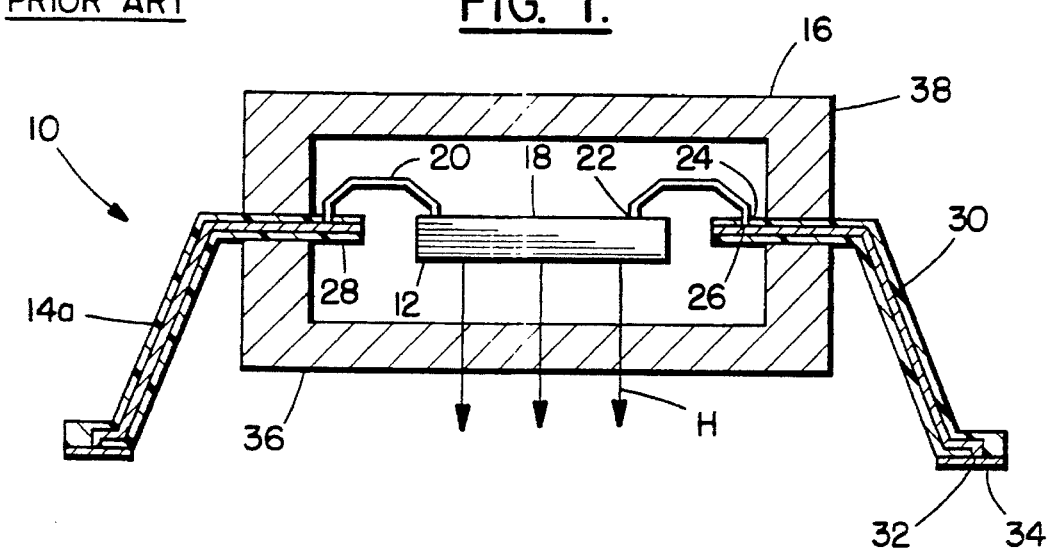
FIG. 1 is a schematic sectional view of an electronic device known in the prior art.

Referring to FIG. 1, there is shown a schematic sectional view of an electronic package 10 known in the prior art. The package 10 generally comprises an electronic component 12, a lead frame 14a and a casing 16. The component 12 is a semiconductor chip with electrical connection areas on a top side 18. Wires 20 have first ends 22 bonded to the electrical connection areas on the top side 18 of the chip 12. Second ends 24 of the wires 20 are bonded to electrical connection pads 26 on an interior edge 28 of the lead frame 14a. The lead frame 14a has conductive leads 30 that extend to its outer bottom edge 32 with pads 34 for connection to an electronic device (not shown). The casing 16 is made of metal, is attached to the lead frame 14a, and surrounds the chip 12 and wires 20. The casing 16 has a base 36 and a cover 38. Features of the present invention could also be used with other types of integrated circuit packages. The chip 12 has a thermal path of heat dissipation in a downward direction, as shown by lines H. This is known as a cavity up configuration. Another type of electronic package is known with the same type of lead frame and casing, but housing a different chip (not shown) with connection pads on its bottom side with a thermal path of heat dissipation in an upward direction. This is known as a cavity down configuration. In order to provide both cavity up and cavity down configurations, a manufacturer needs two different types of chips.

Figure 2:
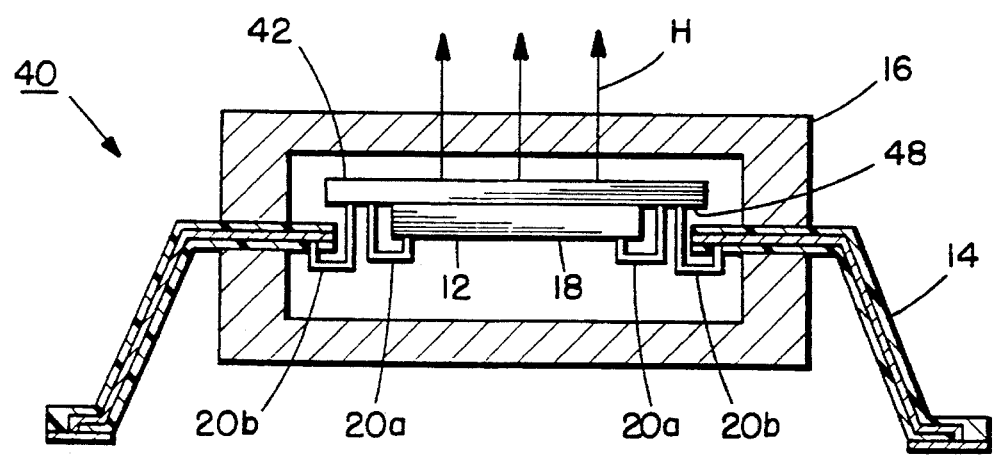
FIG. 2 is a schematic sectional view of an electronic device incorporating features of the present invention.
Figure 3:
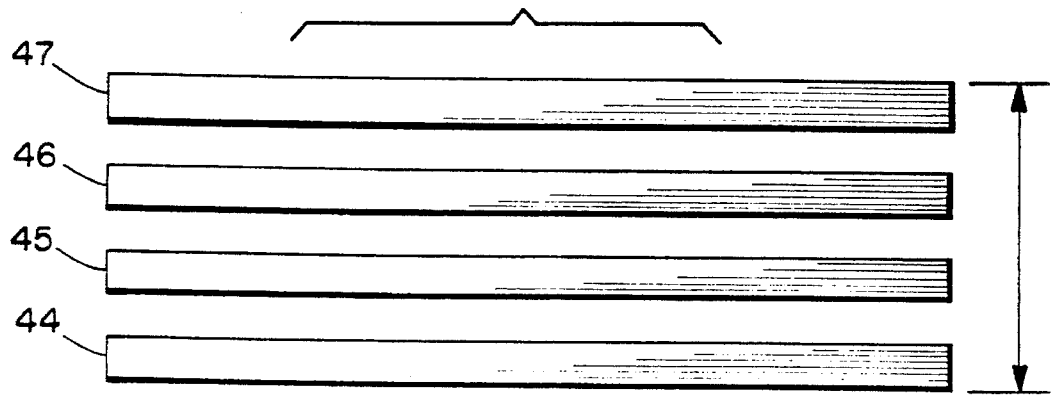
FIG. 3 is a diagrammatical sectional illustration of various layers in the interposer of the electronic device shown in FIG. 2.

Referring also to FIG. 2, there is shown a schematic sectional view of a package 40 incorporating features of the present invention. The package 40 includes the chip 12, a lead frame 14, the casing 16, and a redistribution interposer 42. The interposer 42 is preferably comprised of ceramic material with multiple layers of conductive material. Referring also to FIG. 3, in the embodiment shown, the interposer 42 has four layers 44, 45, 46, 47 of conductive material. The first layer 44 is a wirebond layer located on the bottom side 48 of the interposer 42. The second layer 45 is a first group of redistribution leads or traces. The third layer 46 is a ground layer. The fourth layer 47 is a second group of redistribution leads or traces.

Figure 4A:
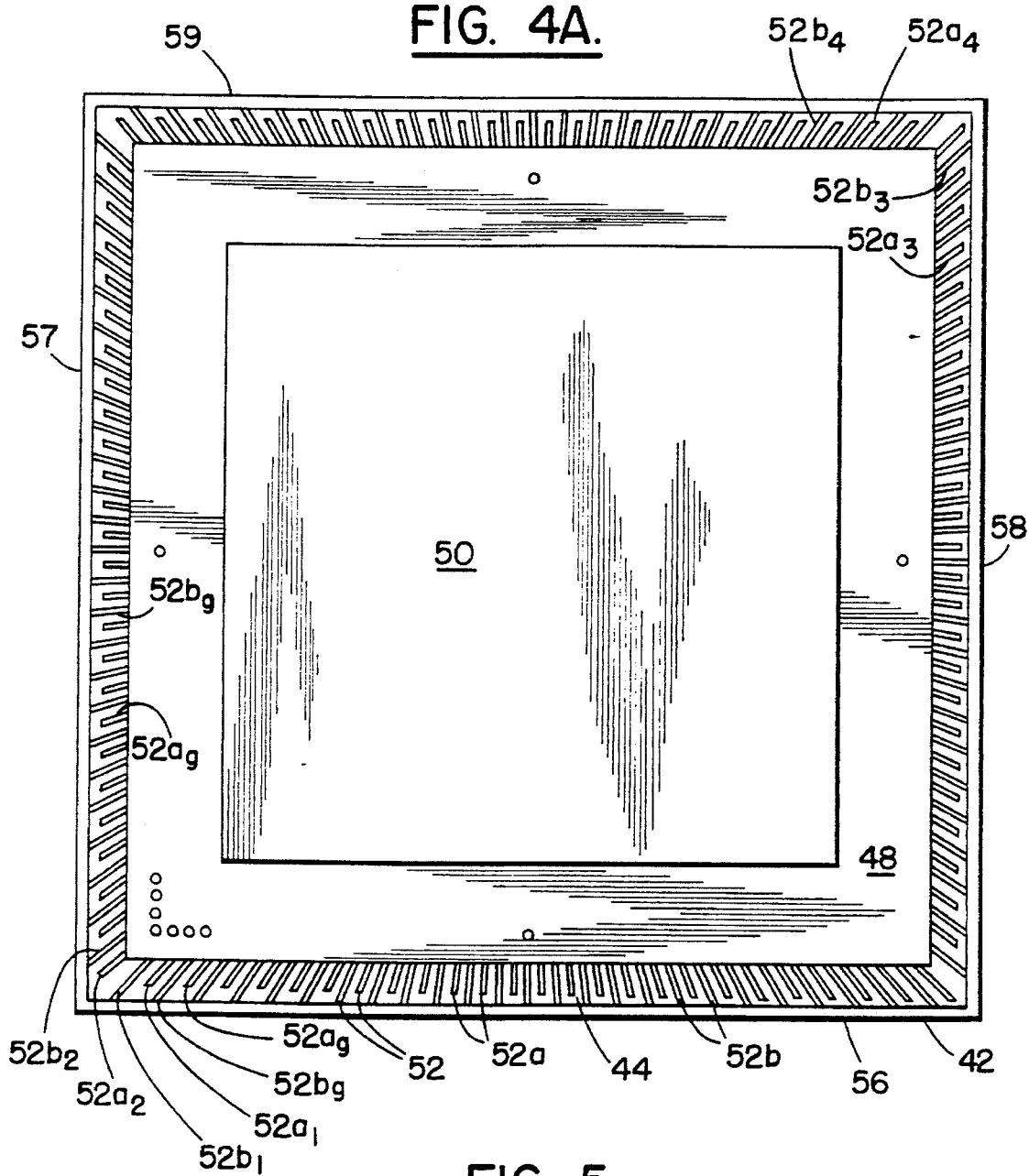
FIG. 4A is a plan bottom view of the interposer of the electronic device shown in FIG. 2 showing a first layer having wirebound pads.

Referring also to FIG. 4A, the wirebond layer 44 on the bottom side 48 of the interposer 42 is shown. The bottom of the chip 12 is directly attached to the bottom side 48 of the interposer 42 in center area 50 as will be described below. Located around the perimeter of the bottom side 48 are two groups of electrical connection pads 52. The first group 52a of pads 52 are electrically connected to the chip 12 by wires 20a. The second group 52b of pads 52 are electrically connected to the pads 26 of the lead frame 14 by wires 20b.

Figure 4B:
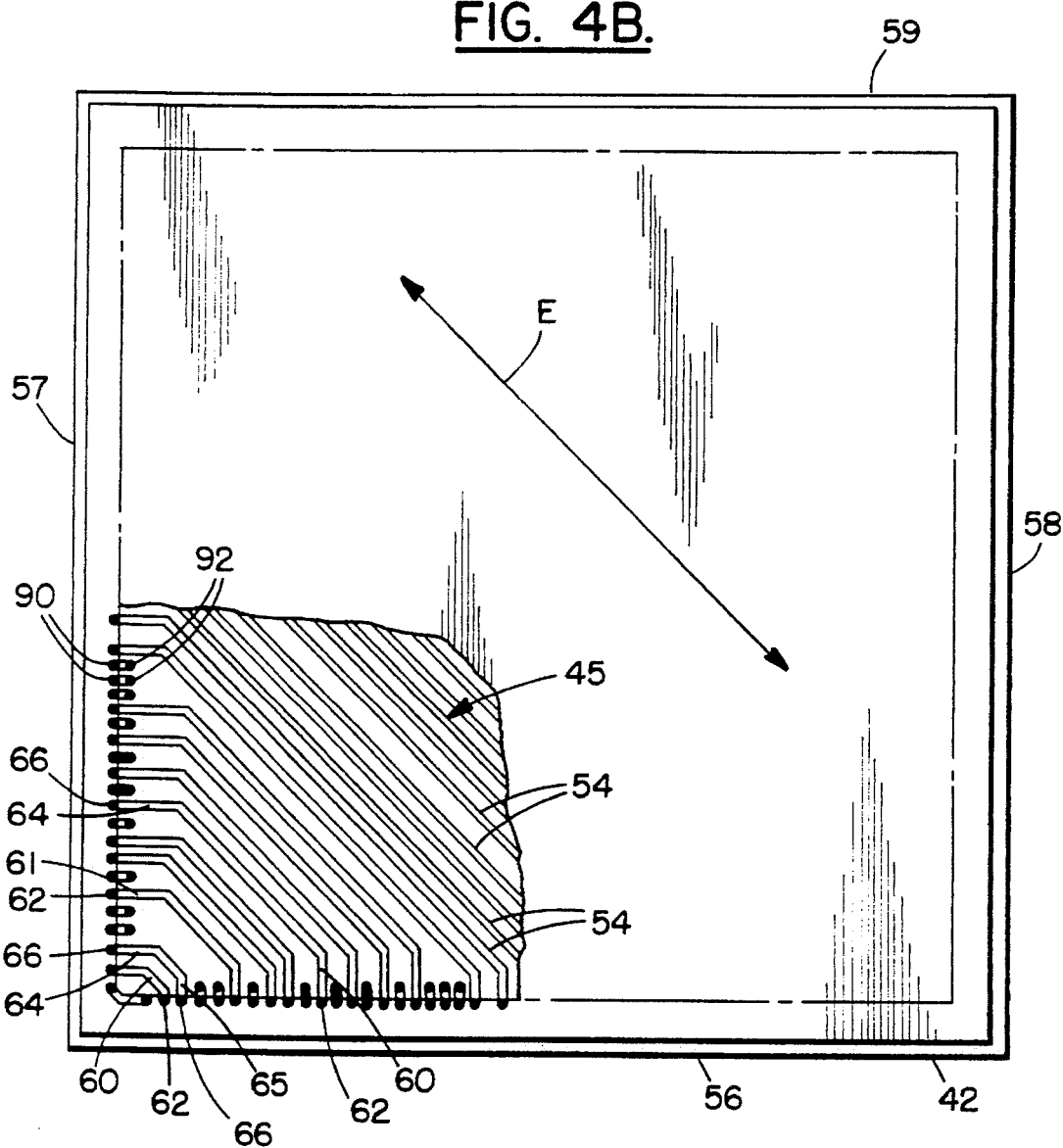
FIG. 4B is a schematic bottom view of the interposer as in FIG. 4A with a cut away section showing a second layer redistribution traces or circuits.

Referring also to FIG. 4B, a schematic bottom view of the interposer is shown with a cut-away section showing a portion of the first group of redistribution leads 54 in the second layer 45. The first group of leads 54 extend in a general diagonal direction from a first side 56 to a second adjacent side 57 and a third side 58 to a fourth adjacent side 59 of the interposer 42. The first group of leads 54 all lie in the same plane. First ends 60 of some of the these leads 54 are individually connected to the first pads $52a_1$ on the first side 56 and first pads $52a_3$ on the third side 58 by a first group of interplane conductors 62. Opposite second ends 64 of these leads 54 are individually connected to the second pads $52b_2$ on the second side 57 and second pads $52b_4$ on the fourth side 59 by a second group of interplane conductors 66. First ends 61 of the rest of the leads 54 are individually connected to the first pads $52a_2$ on the second side 57 and first pads $52a_4$ on the fourth side 59 by the first group of interplane conductors 62. Opposite second ends 65 of these remaining leads 54 are individually connected to the second pads $52b_1$ on the first side of the second pads $52b_3$ on the third side 58 by the second group of interplane conductors 66. In this manner, first pads $52a_1$ on the first side 56 are connected to second pads $52b_2$ on the second side 57, first pads $52a_3$ on the third side 58 are connected to second pads $52b_4$ on the fourth side 59, first pads $52a_2$ on the second side 57 are connected to second pads $52b_1$ on the first side 56, and first pads $52a_4$ on the fourth side 59 are connected to second pads $52b_3$ on the third side 58.

Figure 4C:
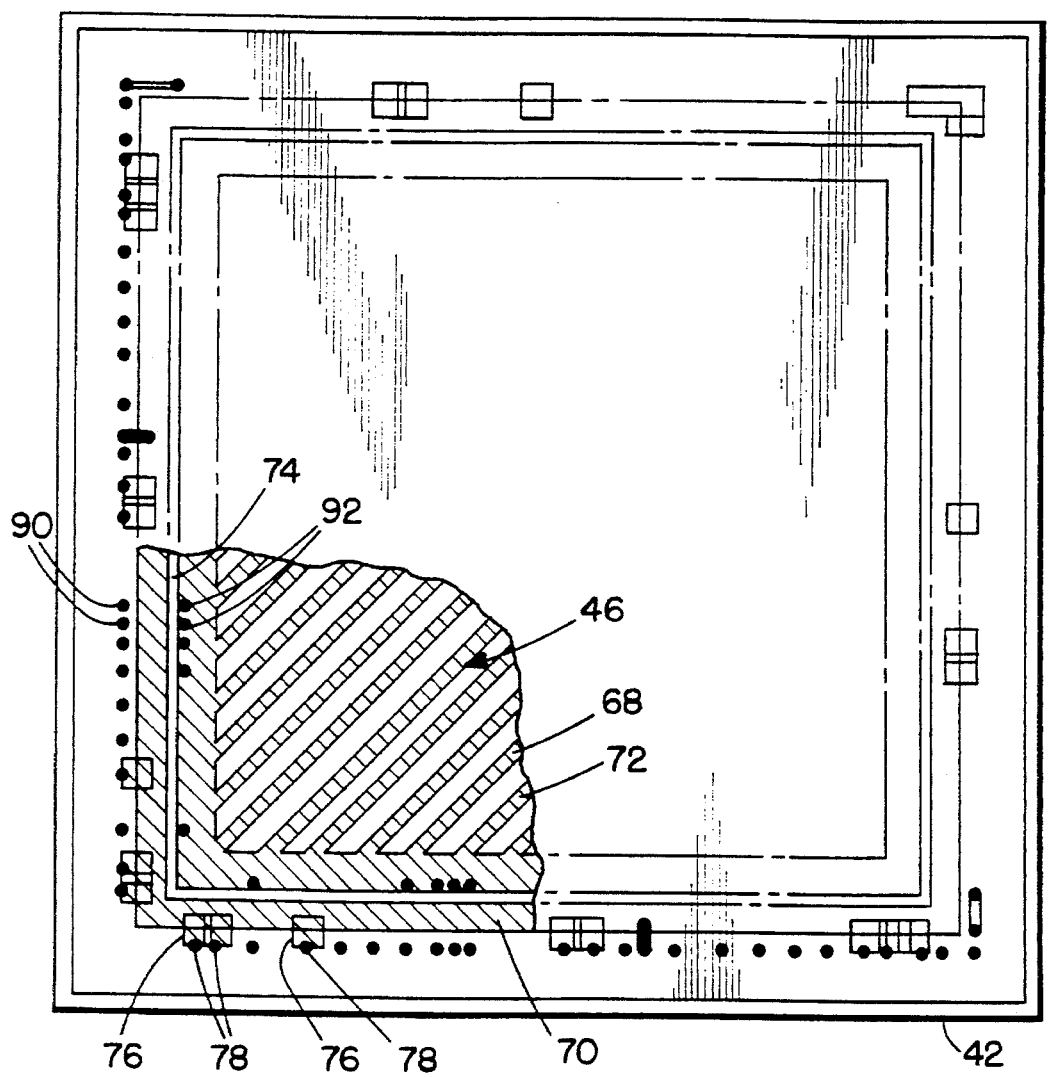
FIG. 4C is a schematic bottom view of the interposer as in FIG. 4A with a cut away section showing a third layer forming a ground layer.

Referring also to FIG. 4C, a schematic bottom view of the interposer 42 is shown with a cut-away section showing a portion of the ground 68 in the third layer 46. The ground 68, in the embodiment shown, has a first section 70 and a second section 72. A gap 74 is provided between the two sections 70, 72. In alternate embodiments no ground section need be provided, or only one ground section, or more than two ground sections could be provided. The first and second ground sections 70, 72 lie in the same plane. The first section 70 is connected to ground pads $52a_g$ and $52b_g$ of both the first and second pads 52a and 52b on all four sides 56–59 by conductive traces 76 and a third group of interplane conductors 78.

Referring also to FIG. 4D, a schematic bottom view of the interposer 42 is shown with a cut-away section showing a portion of the second group of redistribution leads 80 in the fourth layer 47. The leads 80 function the same as leads 54. A fourth group 82 of interplane conductors connect first ends 84 of the leads 80 to first pads 52a on the wirebond layer 44 and second ends 86 to second pads 52b on the wirebond layer 44. The fourth layer 47 also comprises ground traces 88. A fifth group 90 of interplane conductors connect the traces 88 to some of the ground pads $52a_g$ and $52b_g$. A sixth group 92 of interplane conductors connect the traces 88 to the second section 72 of the ground 68 in the third layer 46.

Figure 5:
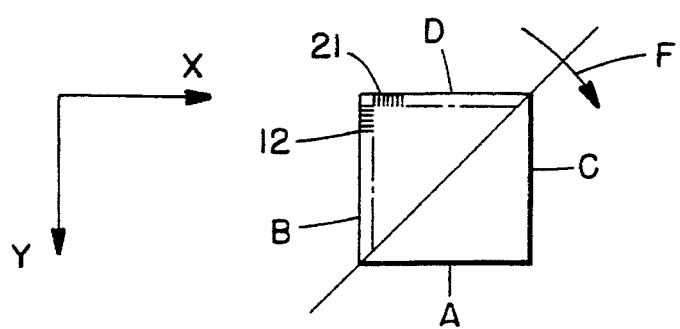
FIG. 5 is a diagrammatic view of how a chip is reoriented or flipped in order to be mounted to the interposer.

As noted above, the chip 12 is mounted to the bottom side 48 of the interposer in center area 50. The chip 12 is mounted in a flipped or upsidedown orientation relative to its normal orientation in the cavity up configuration shown in FIG. 1. The orientation of the chip 12 is flipped on a diagonal as illustrated in FIG. 5. Because of this diagonal flip F from the chip's normal orientation shown in FIG. 1, connection areas or pads 21 which formerly faced an upward direction will now be located in a downward direction. In addition, the connection pads 21 on the chip 12 will be diagonally reversed. In other words, pads formerly on side A will now be on side B, pads formerly on side B will now be on side A, pads formerly on side C will now be on side D, and pads formerly on side D will now be on side C. Because the lead frame 14 of the package 40 is substantially the same as the lead frame 14 of the package 10, the redistribution interposer 42 uses its redistribution leads 54 and 80 to correct for the diagonal reversal. If the diagonal reversal was not corrected for, the lead frame 14 would connect the pads 21 of the chip to the wrong contact areas of the electronic device (not shown) that the package 40 is connected to. Use of the interposer 42 has been found to be the most effective means for connecting for the diagonal reversal. A single chip 12 can be used for both cavity up and cavity down oriented packages. The electronic device (not shown) does not need to be redesigned. The lead frame 14 does not need to be redesigned. The size of the package 40 is the same size as the package 10. This is all accomplished with an increased thermal performance because the heat H from the chip 12 can now be directed upward as shown in FIG. 2 and removed to the air, such as with a heatsink mounted on the top of the package, rather than downward, towards the electronic device or printed wiring board (not shown), as done in the prior art shown in FIG. 1.

After the chip 12 is joined to the ceramic of the interposer 42 in area 50, the pads 21 are wirebonded to pads 52a by wires 20a. The pads 52b are wirebonded to pads 26 of the lead frame 14 by wires 20b. The wires 20b structurally support the interposer 42 and chip 12 on the lead frame 14. The casing 16 is then attached to the lead frame 14 to enclose the chip 12, interposer 42, and wires 20a, 20b. In an alternate embodiment, rather than having the wires 20b structurally support the interposer 42, the interposer 110 is joined to a lead frame pad 43 (see FIG. 7) prior to joining of the chip 12 on the interposer.

Because the redistribution leads 54 and 80 extend between sides 56 and 57 and sides 58 and 59 in diagonal direction E, a pad 21 of the chip 12 is connected to the lead frame 14 by a pad 52b located at an opposite diagonal side of the chip 12 than the pad 21. Thus, the interposer 42 corrects for the diagonal flip of the chip 12 in order for the correct pad 21 of the chip 12 to be connected to the correct pad 26 of the lead frame 14. In an alternate embodiment, a redistribution interposer could be designed to receive multiple chips to form a multi-chip module (MCM). The interposer of the present invention can also be used with new chips that are designed smaller than chip 12 to reduce the bond pad pitch to less than can be accomplished on a lead frame. This allows smaller chips to be used in a given lead count package. In an alternate embodiment, only one layer of redistribution leads could be provided or, more than two layers of the redistribution leads could be provided. In the embodiment described above, the two layers 45 and 47 were provided because there was not enough area on one layer to have all of the leads 54, 80. A diagonal flip of the chip 12 was used because this provided the simplest design of the interposer 42 and its leads 54, 80. However, non-diagonal flipping could be used if the leads of the interposer were properly designed to correct for any flip-caused misalignments with the pads 26 on the lead frame. A non-diagonal flip about either one of the main axes X, Y (see FIG. 5) could be used. In such a case, the pads on two of the sides would be reoriented 180° rather than 90°, and the traces on the interposer would be designed to compensate for this reorientation. In addition, the pads on the other two sides would remain on the same pre-flip side, but would be reoriented 180° on that same side. The traces on the interposer would also be designed to compensate for this type of reorientation.

Figure 6:
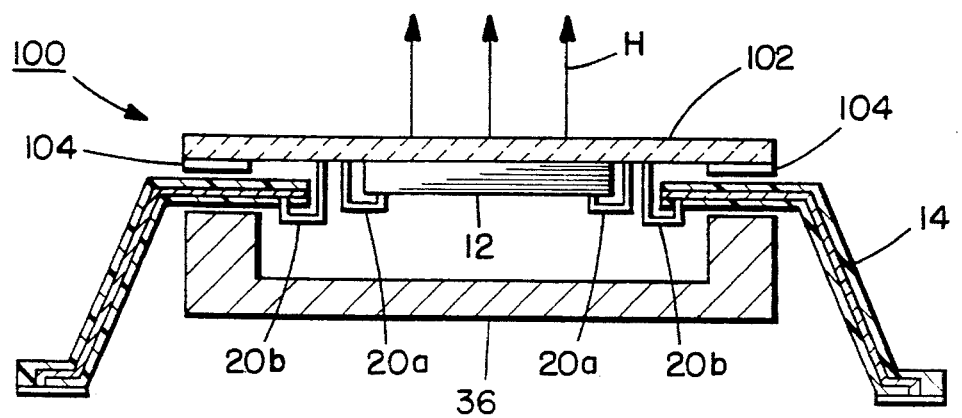
FIG. 6 is a schematic sectional view of an alternate embodiment of an electronic package incorporating features of the present invention.

Referring now to FIG. 6, an alternate embodiment is shown. The electronic package 100 has the chip 12, the lead frame 14, base 36, wires 20a, 20b, and an interposer 102. The interposer 102 is suitably sized and shaped to form a cover for the package 100. The interposer 102 is structurally connected to the lead frame 14 at its perimeter at area 104.

Figure 7:
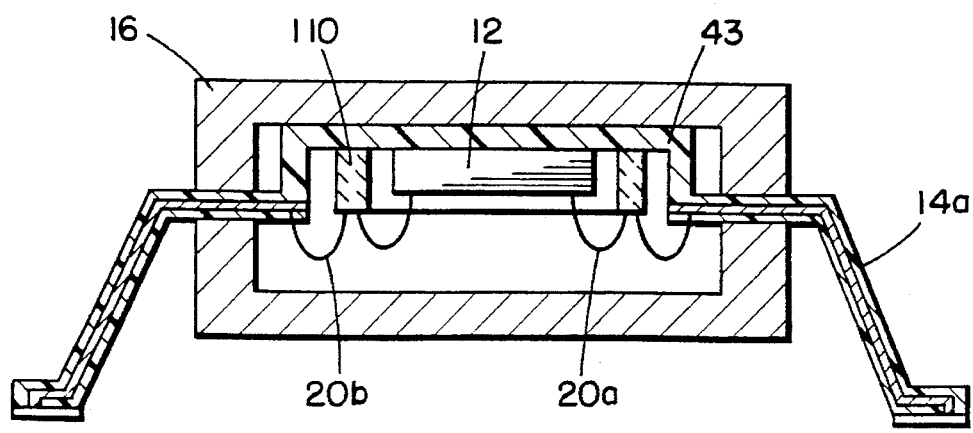
FIG. 7 is a schematic sectional view of another alternate embodiment of the present invention.

Referring now to FIG. 7, another alternate embodiment is shown. In this embodiment, the lead frame 14a has a lead frame pad 43. The interposer 110 is mounted to the lead frame pad 43. The chip 12 also mounted to the lead frame pad 43. The interposer 110 has a general ring shape with the chip 12 located inside its center aperture. Wires 20a, 20b electrically connected the chip 12 to the interposer 110 and the interposer 110 to the electrical pads of the lead frame 14a, respectively.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. In an electronic package having an electrical component, a lead frame, and a casing, the improvement comprising:

a redistribution interposer having at least one group of redistribution conductors, each redistribution conductor having a first end electrically connected to a pad of the electrical component and a second end electrically connected to a pad of the lead frame, at least some of the second ends being located at different sides of the interposer than corresponding first ends of the same conductors and, the first and second ends being located around a side perimeter of the interposer and interspaced, at least partially, with each other.

2. An electronic package as in claim 1 wherein the electrical component is a semiconductor chip.

3. An electronic package as in claim 2 wherein the chip is fixedly attached to the interposer.

4. An electronic package as in claim 1 wherein the casing includes a metal base member attached to the lead frame.

5. An electronic package as in claim 4 wherein the casing includes a metal cover member attached to the lead frame.

6. An electronic package as in claim 4 wherein the interposer forms a cover portion of the casing.

7. An electronic package as in claim 1 wherein the interposer comprises ceramic material with the conductors thereon.

8. An electronic package as in claim 7 wherein the interposer has at least two layers of redistribution conductors.

9. An electronic package as in claim 8 wherein the interposer includes a ground layer and a wirebond layer.

10. An electronic package as in claim 1 wherein the first ends are arranged in an inner generally ring shaped pattern and the second ends are arranged in an outer generally ring shaped pattern.

11. An electronic package as in claim 1 wherein at least some of the second ends are located at a side of the interposer at least 90° offset from a side of their corresponding first end.

12. An electronic package comprising:

a semiconductor chip having electrical connection areas;

a redistribution interposer electrically connected to the chip, the interposer having at least two layers of redistribution leads, each lead having a first end and a second end, the first ends being electrically connected to the electrical connection areas of the chip;

a lead frame having electrical connection pads, the second ends of the redistribution leads being electrically connected to the electrical connection pads; and a casing connected to the lead frame and enclosing, at least partially, the chip and interposer.

13. A package as in claim 12 wherein the chip is stationarily mounted to a bottom surface of the interposer.

14. A package as in claim 12 wherein the interposer is structurally supported on the lead frame only by wire leads that connect the second ends to the electrical connection pads.

15. A package as in claim 12 wherein the first ends and second ends are located on a bottom surface of the interposer as inner and outer general ring shapes.

16. A package as in claim 12 wherein the interposer further comprises ceramic material with a ground layer and a wirebond layer.

17. A package as in claim 12 wherein the second ends of the redistribution leads are located at different sides of the interposer than each of their corresponding first ends.

18. A package as in claim 12 wherein each of the electrical connection areas of the chip is electrically connected by the interposer to a flip-side orientated electrical connection pad on the lead frame.

19. In an electronic package having an electrical component and a lead frame, the improvement comprising:

a redistribution interposer having at least two separate layers of conductive material, one of the layers having at least one group of redistribution conductors, each redistribution conductor having a first end electrically connected to the electrical component and a second end electrically connected to the lead frame, the first and second ends being located at sides of the interposer, all of the redistribution conductors each having a first end on one of the sides and its corresponding second end on another different one of the sides.

20. An electronic package as in claim 19 wherein the layers include at least two layers of redistribution conductors.

21. An electronic package as in claim 19 wherein the layers include a ground layer.

22. In an electronic package having an electrical component and a lead frame, the improvement comprising:

a redistribution interposer having at least one group of redistribution conductors, each redistribution conductor having a first end electrically connected to the electrical component and a second end electrically connected to the lead frame, all of the second ends being located at a side of the interposer that is different than another side of the interposer that a corresponding first end of the same conductor is located at.

23. An electronic package as in claim 22 wherein the interposer includes at least two separate layers of redistribution conductors.

24. An electronic package as in claim 22 wherein the interposer includes a separate ground layer.

* * * * *